United States Patent
Tsuda et al.

(10) Patent No.: US 6,246,104 B1
(45) Date of Patent: *Jun. 12, 2001

(54) SEMICONDUCTOR DEVICE AND METHOD FOR MANUFACTURING THE SAME

(75) Inventors: Hisanori Tsuda, Atsugi; Hidenori Watanabe, Hiratsuka, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/840,897

(22) Filed: Apr. 17, 1997

Related U.S. Application Data

(63) Continuation of application No. 08/527,499, filed on Sep. 13, 1995, now abandoned, which is a continuation of application No. 08/208,696, filed on Mar. 11, 1994, now abandoned.

(30) Foreign Application Priority Data

Mar. 16, 1993 (JP) .................................................. 5-080317
Nov. 29, 1993 (JP) .................................................. 5-298189

(51) Int. Cl.[7] .................................................. H01L 29/00
(52) U.S. Cl. .................. 257/558; 257/197; 257/592; 257/616; 257/557
(58) Field of Search .......................... 257/197, 198, 257/19, 592, 591, 616, 347, 352, 557, 558

(56) References Cited

U.S. PATENT DOCUMENTS

| | | | |
|---|---|---|---|
| 4,717,681 | * | 1/1988 | Curran .................................. 257/197 |
| 5,100,810 | * | 3/1992 | Yoshimi et al. ....................... 437/21 |
| 5,126,278 | * | 6/1992 | Kodaira ................................. 437/24 |
| 5,140,400 | * | 8/1992 | Morishita ............................. 257/197 |
| 5,187,554 | * | 2/1993 | Miwa ................................... 257/587 |
| 5,198,689 | * | 3/1993 | Fujioka ................................ 257/592 |
| 5,241,211 | * | 8/1993 | Tashiro ................................ 257/347 |
| 5,285,088 | * | 2/1994 | Sato et al. ............................. 257/192 |
| 5,323,032 | * | 6/1994 | Sato et al. ............................. 257/592 |
| 5,329,144 | * | 7/1994 | Luryi .................................... 257/197 |
| 5,356,821 | * | 10/1994 | Naruse et al. ......................... 437/34 |
| 5,494,836 | * | 2/1996 | Imai ...................................... 437/31 |

FOREIGN PATENT DOCUMENTS

| | | | |
|---|---|---|---|
| 0168771 | | 1/1986 | (EP) ........................... H01L/21/306 |
| 0443852A1 | * | 2/1991 | (EP) . |
| 0443852A1 | * | 8/1991 | (EP) . |
| 0443852 | | 8/1991 | (EP) ............................ H01L/29/73 |
| 0504875 | | 3/1992 | (EP) ............................ H01L/29/73 |
| 3-292740 | * | 12/1991 | (JP) . |
| 406268208A | * | 9/1994 | (JP) ......................................... 29/74 |

OTHER PUBLICATIONS

Sato et al. "A Super Self–Aligned Selectively Grown SiGe Base (SSSB) Bipolar Transistor Fabricated by Cold–Wall Type UHV/CVD Technology", 1994 IEEE.*

Sato et al. "A Super Self–Aligned Selectively Grown SiGe Base (SSSB) Bipolar Transistor Fabricated by Cold–Wall Type UHV/CVD Technology", 1994 IEEE.*

* cited by examiner

Primary Examiner—Steven Loke
Assistant Examiner—Douglas W. Owens
(74) Attorney, Agent, or Firm—Fitzpatrick, Cella, Harper & Scinto

(57) ABSTRACT

An Si semiconductor device has an emitter region, a base region and a collector region formed on a substrate substantially in parallel to a plane of the substrate. And at least one of the emitter region the base region and the collector region includes an SiGe mixed crystal semiconductor region formed by ion implantation of Ge.

9 Claims, 16 Drawing Sheets

SEMICONDUCTOR DEVICE AND METHOD FOR MANUFACTURING THE SAME

This application is a continuation of application Ser. No. 08/527,499, filed Sep. 13, 1995, now abandoned, which was a continuation of application Ser. No. 08/208,696, filed Mar. 11, 1994, now abandoned.

BACKGROUND OF THE INVENTION

1. Field of the Invention

The present invention relates to a highly integrated and high performance semiconductor device having transistors formed in a semiconductor layer on an insulating surface and a method for manufacturing the same.

The present invention also relates to a semiconductor device and more particularly to a lateral bipolar transistor structure and a method for manufacturing the same.

2. Related Background Art

In a prior art silicon wafer bulk process, a vertical bipolar transistor is manufactured in a manner shown in FIG. 28. In FIG. 28, numeral 301 denotes a first vertical npn-type bipolar transistor, numeral 302 denotes a second npn-type bipolar transistor, and numeral 303 denotes a device isolation region for electrically isolating the bipolar transistor 301 and the bipolar transistor 302. In FIG. 28, a collector of the bipolar transistor 301 and an emitter of the bipolar transistor 302 are electrically connected by an electric conductor 315. Numeral 304 denotes a p-type silicon substrate, numerals 305 and 305' denote n$^+$-type regions which serve as collector regions of the bipolar transistors 301 and 302, respectively, numeral 306 denotes an n$^-$-type epitaxial region, numeral 307 denotes a p-type region for electrically isolating the bipolar transistor 301 and the bipolar transistor 302, numeral 308 denotes a selective oxidization region, numerals 309 and 309' denote collector lead layers, numerals 310 and 310' denote p-type base regions, numerals 311 and 311' denote n$^+$-type emitter regions, numeral 312 denotes an interlayer insulating layer, numerals 313, 314, 315, 316 and 317 denote Al (aluminum) electrodes, and numeral 318 denotes a passivation insulating layer.

In a prior art silicon wafer bulk process, a lateral bipolar transistor is manufactured in a manner shown in FIG. 29. In FIG. 29, numeral 321 denotes a first lateral pnp-type bipolar transistor, numeral 322 denotes a second lateral pnp-type bipolar transistor, and numeral 323 denotes a device isolation region for electrically isolating the bipolar transistor 321 and the bipolar transistor 322. In FIG. 29, a collector of the bipolar transistor 321 and an emitter of the bipolar transistor 322 are electrically connected by a wiring 335. Numeral 324 denotes a p-type silicon substrate, numerals 325 and 327 denote n$^+$-type regions which serve as base regions of the bipolar transistors 321 and 322, respectively, numeral 326 denotes an n$^-$-type epitaxial region, numeral 327 denotes a p-type region for electrically isolating the bipolar transistor 321 and the bipolar transistor 322, numeral 328 denotes a selective oxidization region, numerals 329 and 329' denote base lead layers, numerals 330 and 330' denote p$^+$-type emitter regions, numerals 331 and 331' denote p$^+$-type collector regions, numeral 332 denotes an interlayer insulating layer, numerals 333, 334, 335, 336 and 337 denote Al electrodes, and numeral 338 denotes a passivation insulating layer.

In the prior art vertical bipolar transistor described above, a hetero-junction bipolar transistor has been known which uses a mixed crystal semiconductor $Si_{(1-x)}Ge_x$ (where X is a crystal mixture ratio) as a base region in order to enhance an operation speed of the transistors. When the base region is made of SiGe mixed semi-conductor 1 hetero-junction bipolar transistor having a narrow gap base region is the result. In order to make this narrow gap base region in an npn transistor, usually epitaxial growth of a p-type SiGe is used. However, the following problems are encountered.

(1) A defect may be easily produced because of an abrupt change of composition at the interface of the Si substrate and the $Si_{(1-x)}Ge_x$ layer.

(2) Compatibility with the existing manufacturing process is poor. For example, when a Bi-CMOS circuit combined with MOS transistors and bipolar transistors are to be manufactured, the process is very complex.

On the other hand in order, to enhance an operation speed of the transistors, a lateral bipolar transistor is formed on an Si substrate. However, the manufacturing process is more complex than that for a vertical bipolar transistor if a narrow gap base is to be formed.

Further, in the prior art hetero-junction bipolar transistor, either lateral or vertical, which is made by epitaxial growth, the interface between the Si crystal which forms the emitter region and $Si_{(1-x)}Ge_x$ which forms the base region corresponds to the interface between the emitter and the base or the interface between the base and collector. As a result, lattice defects such as point defects or dislocations, both of which serves as the centers of the electrical recombination, is produced in the vicinity of a junction interface of the emitter and the base or in the vicinity of a junction interface of the base and the collector, so that the base current of the bipolar transistor increases and the current amplification factor $h_{FE}$ decreases.

In order to increase operation speed of a bipolar transistor, a heterobipolar transistor with the above described narrower base region may be provided. Also, a structure wherein the Si region is formed on an insulating layer (substrate) (SOI structure) and a lateral bipolar transistor is formed on the Si region may be used therefor. This is because when a transistor is formed on an insulating layer, the transistor with a reduced parasitic capacitance in relation to a substrate, and without latch-up can be provided. In such SOI lateral type bipolar transistor of npn type, for example, the Si region operating as a base is doped with ions such as B, thereby forming the base region into a p-type layer. FIG. 30 shows the above described structure. 4 denotes an insulating layer. 5 denotes n$^-$-type silicon layer formed on an insulating film 4. 6 denotes a selective oxidation layer. 8 denotes a p-type polysilicon layer operating as a base extraction electrode. 10 denotes an n$^+$-type region operating as an emitter. 11 denotes an n$^+$-type region operating as a collector. 12 denotes a p-type region operating as a base. 14 denotes an emitter electrode. 15 denotes a collector electrode. 16 denotes a base electrode.

However, in the case of the above described structure, the p-type polysilicon 8 operating as the base extraction electrode and p-type Si 12 operating as the base region have energy band gaps at substantially the same potential level. Accordingly, a carrier flowing through the base regions would flow into the base electrode. The base current would be greater, and thus cause a problem of undesirably greater $h_{FE}$.

Further, in the prior art vertical and lateral bipolar transistors on the Si substrate, the device isolation region is required to electrically isolate the adjacent bipolar transistors. As a result, the integration density cannot be increased.

Further, in the prior art vertical and lateral bipolar transistors on the Si substrate, contacts and electric conductors are required to connect collectors, emitters or a collector and an emitter of adjacent bipolar transistors. As a result, contact resistances, wiring resistances and wiring capacitances are included in a load so that an operation speed of the transistor is restricted.

Further, when the hetero-junction bipolar transistor having the narrow gap base region of the lateral bipolar transistor is manufactured, the base regions 325 and 325' shown in FIG. 29 are formed by epitaxially growing $Si_{(1-X)}Ge_X$ and then doping with an impurity which is of the opposite conductivity type to that of the gate region in the emitter and collector regions. In this process, however, it is difficult to increase the impurity concentration of the base region so that it is not possible to reduce a carriage base running time ($\tau_B$), because the carrier base running time $\tau_B$ is given by:

$$\tau_B = W_B^2/nD_B$$

where $W_B$ represents a base length, $D_B$ represents a diffusion coefficient and n represents a carrier concentration. In this case, a cutoff frequency of the transistor is substantially inversely proportional to the carrier base running time $\tau_B$. Accordingly, in the prior art lateral bipolar transistor, the cutoff frequency $f_T$ cannot be increased because the carrier concentration cannot be increased. As a result, the operation speed of the lateral transistor cannot be increased.

It has been known that a high speed operation is attained when a MOS transistor is manufactured by using a SOI (silicon on insulator) with a semiconductor film thickness of 5000 Å or less because a substrate capacitance is reduced in the SOI so that high speed turn-on and turn-off may be attained, however, when a circuit is constructed by only MOS structures, a design is restricted when a drive current is required.

Accordingly, in the SOI, a Bi-CMOS which is a combination of MOS and bipolar transistors is attracting notice, because in an SOI having a thin insulating film, the process is easier when lateral bipolar transistors are to be built in then when vertical bipolar transistors are to be built-in. However, the prior art lateral bipolar transistor is inferior in the operating speed to the vertical bipolar transistor.

SUMMARY OF THE INVENTION

It is an object of the present invention to provides a high performance transistor which provide high compatibility with a manufacturing process of a prior art bipolar transistor and exhibits an improved crystalline property in a base layer and in the vicinity of an interface of an emitter and a collector, and a method for manufacturing the same.

It is another object of the present invention to provide a highly integrated and high performance transistor circuit.

It is other object of the present invention to provide a high performance lateral bipolar transistor which provides high compatibility with a manufacturing process of a prior art bipolar transistor and exhibits an improved crystalline property in a base region formed by a mixed crystal semiconductor and in the vicinity of an interface of an emitter and a collector, and a method for manufacturing the same.

A further object of the present invention is that the base region of the lateral bipolar transistor is formed from mixed crystal SiGe, thereby reducing base current injecting carrier into the base.

It is a further object of the present invention to provide a method for manufacturing the above lateral bipolar transistor on Si on an insulating film (SOI).

In order to achieve the above objects, in accordance with the present invention, there is provided a Si semiconductor device having an emitter region, a base region and a collector region formed on a substrate substantially parallelly to a plane of the substrate, wherein at least one of said emitter region, said base region and said collector region includes a SiGe mixed crystal semiconductor region formed by ion implantation of Ge.

Further, in accordance with the present invention there is provided a method for manufacturing a semiconductor device having an emitter region, a base region and a collector region formed on a substrate substantially parallel to a plane of said substrate, at least one of said emitter region, said base region and said collector region including Ge, comprising the step of forming the region including Ge by ion implanting and thermally diffusing Ge ions.

DETAILED DESCRIPTION OF THE PREFERRED EMBODIMENTS

Figure 1:
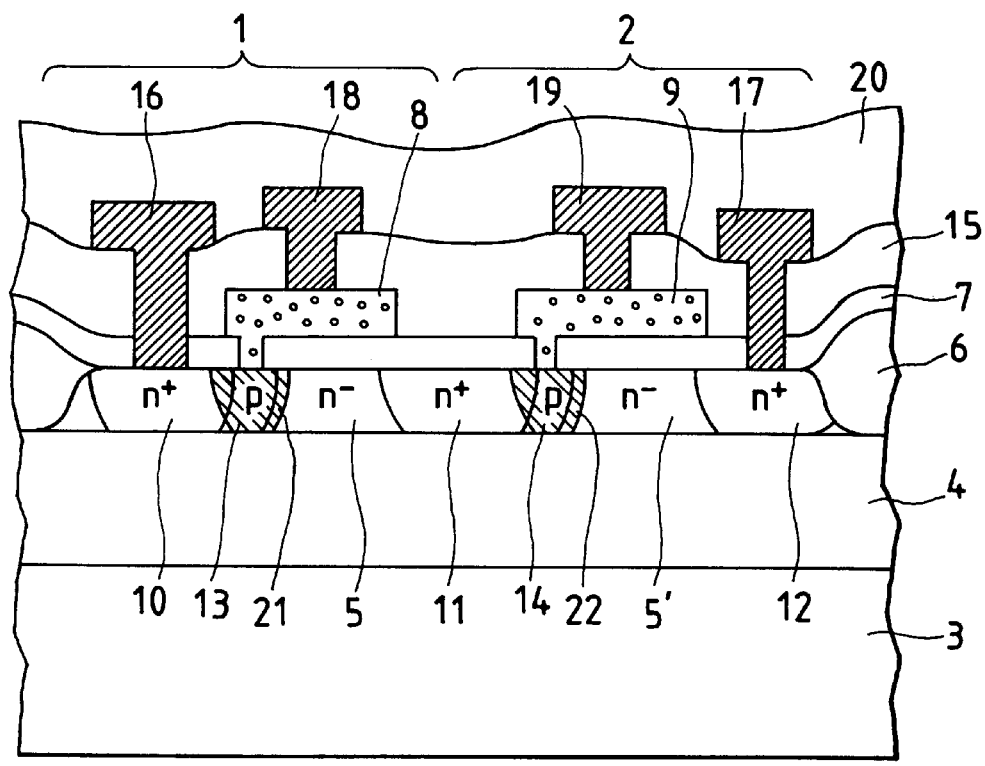
FIG. 1 shows a sectional view of a first embodiment of a semiconductor device of the present invention.

A semiconductor device of the present invention is constructed as described above.

In the semiconductor device of the present invention, Ge is ion-implanted to form a SiGe mixed crystal semiconductor region so that a SiGe mixed crystal semiconductor area having a gradient in crystal mixture ratio can be readily produced. When the SiGe mixed crystal semiconductor area with the gradient crystal mixture ratio is deposited by using an epitaxial growth method, adjustment of the composition is required.

The present invention includes the shifting of an interface of the SiGe mixed crystal semiconductor region and an Si single crystal region from an emitter-base junction interface to an emitter, or from a collector-base junction interface to a collector. In such a structure, an interface of an Si layer and an SiGe layer is shifted toward the emitter and the collector (where the emitter and the collector form main electrode regions and the base forms a control electrode region) to prevent an affect by a point defect of transposition in the vicinity of the junctions of the base and the emitter, and between the base and collector so that a current amplification factor $h_{FE}$ and a high frequency cutoff frequency $f_T$ can be increased.

In the manufacturing process of the semiconductor device of the present invention, Ge is ion-implanted to the base region which is the control electrode region of the bipolar transistor, and Ge is thermally diffused to allow the manufacture of a hetero-junction bipolar transistor having a narrow band gap base region and reduce the defects in the interface of the Si layer and the SiGe layer.

Further, in accordance with the present invention, a lateral bipolar transistor is formed in a semiconductor layer on an insulating surface so that the provision of device isolation and wiring is eliminated when the collators or the emitters of adjacent bipolar transistors are interconnected and a semiconductor device including highly integrated and high speed bipolar transistors is attained.

In a lateral hetero-junction bipolar transistor of the present invention, a gradient may be imparted to a forbidden band of the base region. Accordingly, as shown in FIGS. 20A and 20B, the forbidden band width of the base region facing the emitter is essentially close to a forbidden band width of an Si single body, and it may exhibits the same high efficiency as that of a bipolar transistor formed by the Si single body.

In the Si single body crystal, the forbidden band width is approximately equal to Eg=1.1 eV, and in the Ge single body crystal, it is approximately equal to 0.7 eV. By forming a two-system mixed crystal semiconductor from those two single body semiconductors, the forbidden band width may be varied between 0.7 eV and 1.1 eV. In the present invention, as shown in FIG. 20A, it is possible to make a forbidden band width (Eb") of the collector junction smaller than a forbidden band width (Eg') of the emitter junction. Namely, $\Delta Eg_2 = Eg' - Eg'' > 0$.

Figure 20A:
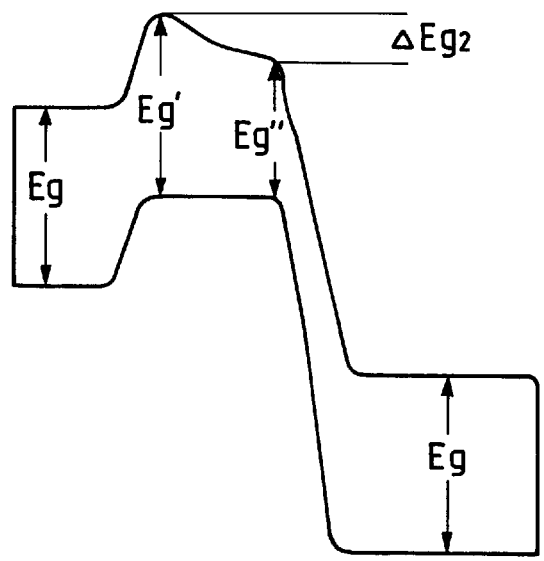
FIG. 20A shows a band chart of an emitter, a base and a collector of a transistor.
Figure 20B:
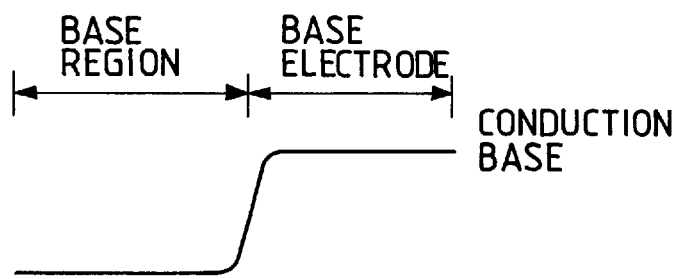
FIG. 20B shows a band chart between a base region and a base electrode in B–B' of FIG. 1, FIGS. 21A and 21B show a manufacturing process of a fifth embodiment.

In the embodiment shown in FIG. 20A, a gradient is imparted in a conduction band in the base region so that conduction electrons are accelerated from the emitter junction to the collector junction. A drift electric field is established by the gradient of the energy band. By utilizing the drift electric field, it is possible to accelerate the carriers such as conduction electrons by an electric field applied externally of the transistor so that the running time ($\tau_B$) of the carriers injected to the base can be reduced. Accordingly, the cutoff frequency ($f_T$) may be increased even in the lateral bipolar transistor.

In the present invention, the range of change of forbidden band width of the base region may be from approximately 5.5 eV for diamond which is usually an insulator but acts as a semiconductor at a high temperature to very close to 0 eV for PbSb-SnTe mixed crystal which is a narrow gap semiconductor. Preferably, it is in a range from 3.5 eV which is in a semiconductor region to 0 eV, and most preferably in a range from 1.1 eV which is attained by SiGe mixed crystal to 0.7 eV.

When a film thickness of a semiconductor layer on a surface of SOI is approximately 5000 Å or less, an affect of vertical distribution of Ge may be neglected so that a preferable thickness of the semiconductor region is 5000 Å or less. Ge which is present in the interface of the semiconductor layer and the insulating film serves as a getter for atoms such as Na which become capture centers when they enter into the semiconductor region in the insulator so that it stabilizes a characteristic of the bipolar transistor. Further, a stray capacitance of the lateral bipolar transistor can be reduced as it is in the semiconductor region on the insulating layer (SOI) formed by Si single body only.

Figure 19:
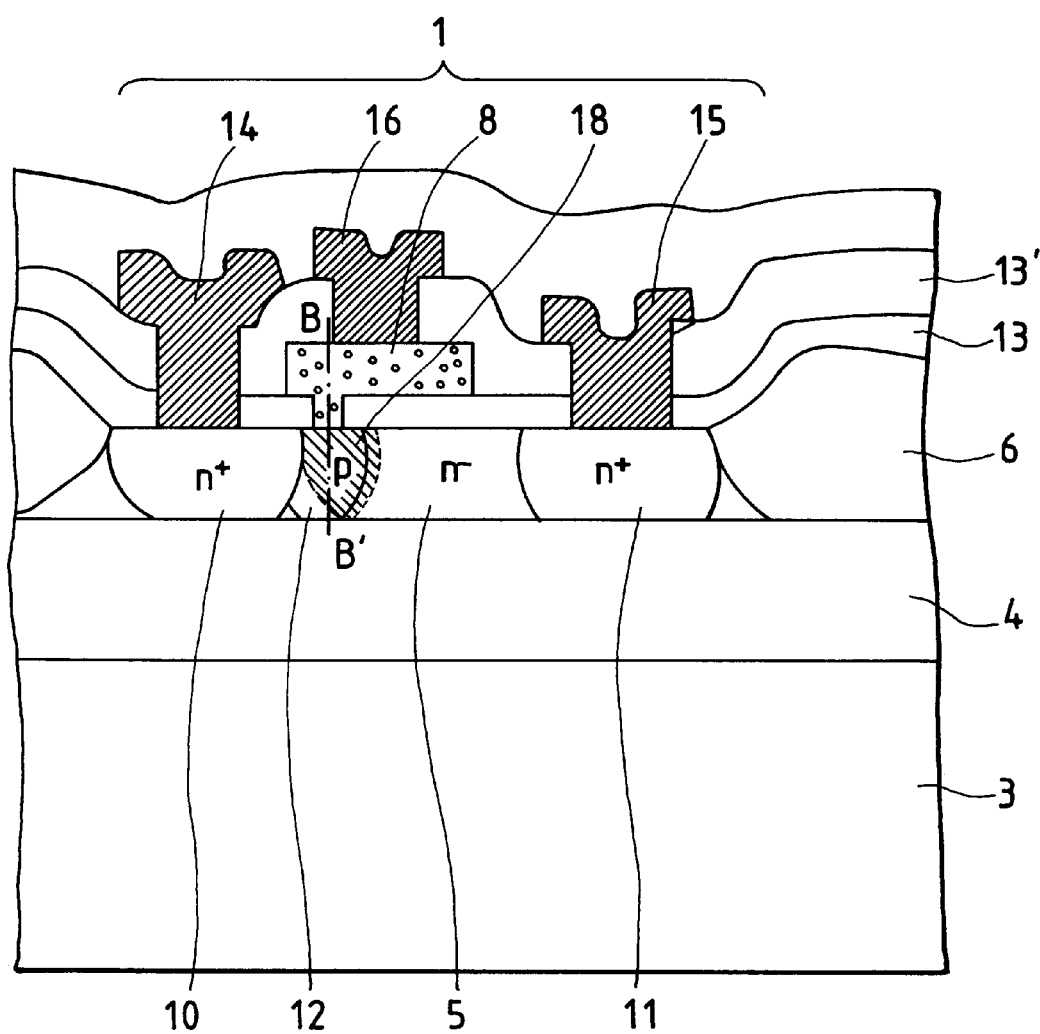
FIG. 19 shows a sectional view of an embodiment of the present invention.

In a preferable condition of the Ge ion implantation, a middle or large current ion implantation apparatus is used, an acceleration voltage is 150 KeV to 200 KeV, and a surface density of ions to prevent the increase of defect is $5 \times 10^{16}$ cm$^{-2}$ or less.

Where a gate electrode for transferring carriers to a base region is formed by polysilicon, the forbidden band widths are different between a base region formed by the SiGe mixed crystal and a gate electrode formed by polysilicon. For example, an energy band of a region between BB' of FIG. 19 is shown in FIG. 20B. The gate electrode formed by polysilicon has a higher energy level at the bottom of the conduction band than that of the base region formed by SiGe. As a result, a base current does not increase and an emitter grounded current gain $h_{FE}$ increases.

In the manufacturing process of the semiconductor device of the present invention, Ge is ion-implanted to form a mixed crystal semiconductor region formed by SiGe. Accordingly, the SiGe mixed crystal semiconductor device having a gradient crystal mixture ratio can be readily formed.

The preferred embodiments of the present invention are now explained with reference to the drawings.

<Embodiment 1>

Figure 2:
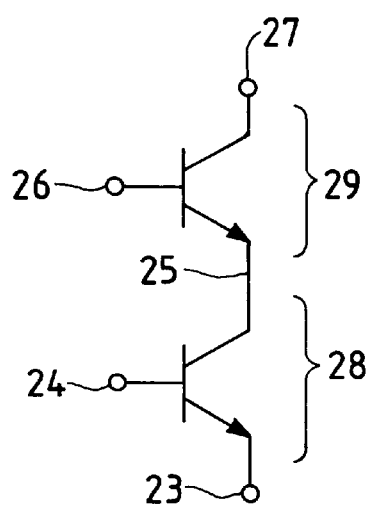
FIG. 2 shows an equivalent circuit of the semiconductor device of FIG. 1.

FIG. 1 shows a sectional view of a first embodiment of the semiconductor device of the present invention, and FIG. 2 shows an equivalent circuit thereof.

In FIG. 1, numeral 1 denotes a first npn-type bipolar transistor, numeral 2 denotes a second npn bipolar transistor, numeral 3 denotes a silicon substrate, numeral 4 denotes an insulating film, numerals 5 and 5' denote an n⁻-type silicon layer formed on the insulating layer 4, numeral 6 denotes a selective oxidization layer, numeral 7 denotes a gate oxidization film, numeral 8 denotes a p-type polysilicon which serves as a base electrode of the first bipolar transistor 1, numeral 9 denotes a p-type polysilicon layer which serves as a base electrode of the second bipolar transistor 2, numeral 10 denotes an n⁺-type region which serves as an emitter of the first bipolar transistor 1, numeral 11 denotes an n⁺-type region which serves as an emitter of the second bipolar transistor 2, numeral 13 denotes a p-type region which serves as a base of the first bipolar transistor 1, numeral 14 denotes a p-type region which serves as a base of the second bipolar transistor 2, numeral 15 denotes an interlayer insulating layer, numeral 16 denotes an emitter electrode of the first bipolar transistor 1, numeral 17 denotes collector electrode of the second bipolar transistor 2, numeral 18 denotes a base electrode of the first bipolar transistor 1, numeral 19 denotes a base electrode of the second bipolar transistor 2, and numeral 20 denotes a passivation film.

A region 21 is an $Si_{(1-x)}Ge_X$ region of the first bipolar transistor and a region 22 is an $Si_{(1-x)}Ge_X$ region of the second bipolar transistor. The regions 21 and 22 are formed by ion implantation of $Ge^+$ as will be described later.

In FIG. 2, numeral 28 denotes the first bipolar transistor 1, numeral 29 denotes the second bipolar transistor 2, numeral 23 denotes the emitter electrode of the first bipolar transistor, numeral 24 denotes the base electrode of the first bipolar transistor, numeral 25 denotes the collector electrode of the first bipolar transistor and the emitter electrode of the second bipolar transistor, numeral 26 denotes the base electrode of the second bipolar transistor, and numeral 27 denotes the collector electrode of the second bipolar transistor.

Figure 3:
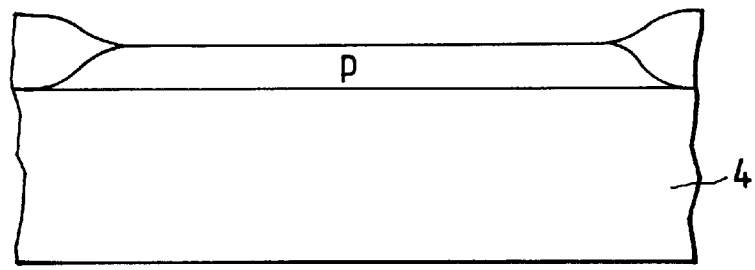
FIG. 3 shows a sectional view of a manufacturing process of the semiconductor device of FIG. 1.
Figure 4:
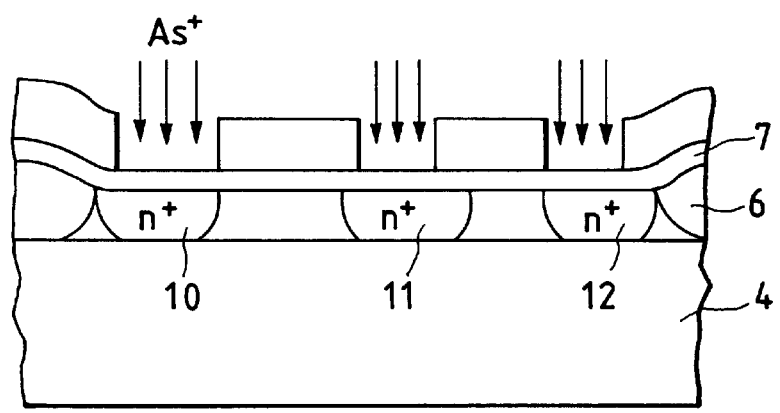
FIG. 4 shows a sectional view of the manufacturing process of the semiconductor device of FIG. 1.
Figure 5:
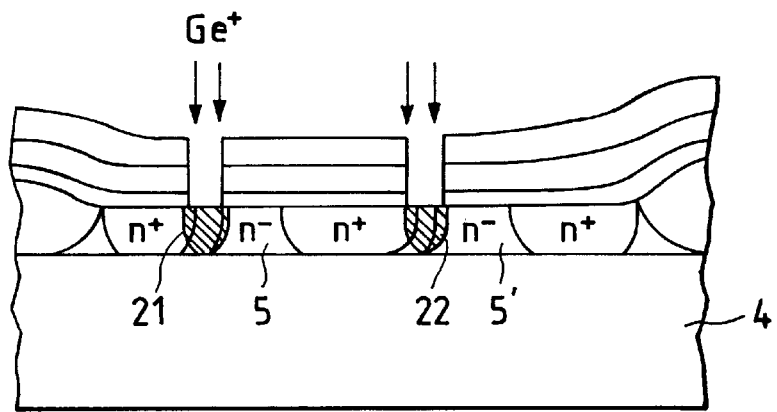
FIG. 5 shows a sectional view of the manufacturing process of the semiconductor device of FIG. 1.
Figure 6:
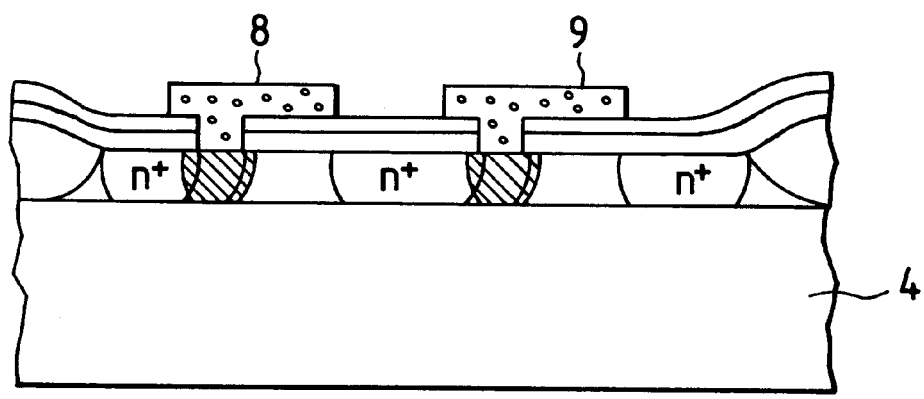
FIG. 6 shows a sectional view of a manufacturing process of the semiconductor device of FIG. 1.
Figure 7:
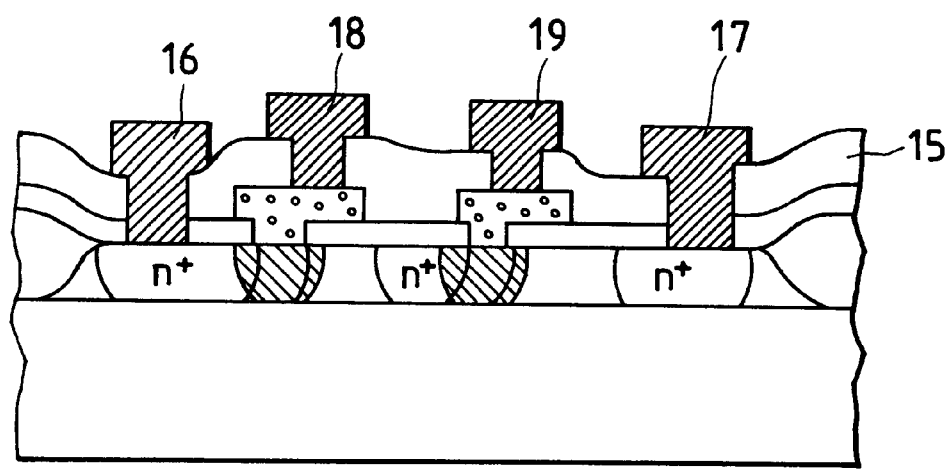
FIG. 7 shows a sectional view of the manufacturing process of the semiconductor device of FIG. 1.
Figure 8:
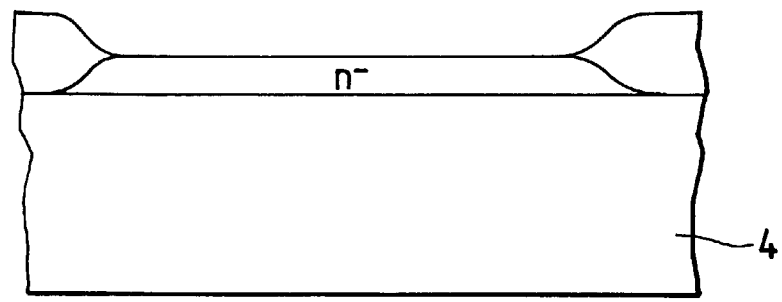
FIG. 8 shows a sectional view of the manufacturing process of the semiconductor device of FIG. 1.

Referring to FIGS. 3 to 7, a manufacturing process of the present embodiment is explained. First, a substrate having a p-type Si layer on the insulating film 4 is prepared (FIG. 3). The substrate structure may be implemented by an SIMOX technique, a wafer bonding technique or a laser recrystallization technique. Then, a field oxidization film is formed, devices are isolated and the gate oxidization film 7 is formed to a thickness of 200 Å. Then, the emitter and collector 10, 11 and 12 are formed by a photo-lithography technique (FIG. 4). In the present embodiment, $As^+$ is implanted at an acceleration energy of 40K eV at $5\times10^{15}$ cm⁻². Source and drain of an N-type MOS transistor may also be formed simultaneously. In a similar manner, the n⁻-type layers 5 and 5' are formed.

Then, an NSG film is formed by a CVD method under an atmospheric pressure, and the oxidization film in the base region is removed by the photo-lithography process. Then, $Ge^+$ is ion-implanted to a desired position (FIG. 5) under an acceleration voltage of 40K eV at $2.5\times10^{15}$ cm⁻². Then, the resist is removed and the assembly is heat processed at 1000° C. for 20 minutes to form the regions 21 and 22.

Then, polysilicon is deposited to a thickness of 5000 Å by the LPCVD process and the polysilicon is patterned into a desired pattern to form the p-type polysilicon layers 8 and 9.

Then, the interlayer insulating layer 15 is formed and a window for taking out the electrode is formed by the photo-lithography process and the etching process.

Then, the electrodes are formed to complete the hetero-junction bipolar transistor shown in FIG. 1 through a patterning process and a passivation process.

In the present embodiment, the lateral bipolar transistor which uses $Si_{(1-x)}Ge_X$ which is the narrow gap material in the base region and in the vicinity of the base region only is attained, and the collector current is larger than that of the prior art lateral bipolar transistor and $f_T$ is as large as ten times. Further, the current amplification factor $h_{FE}$ is approximately 1.5 times as large as that of the prior art lateral bipolar transistor.

This is caused by reduction of the base current with 93% smaller than the prior art.

In the present embodiment, since the n⁺-type layer 11 on the insulating film functions both as the collector region of the first bipolar transistor 1 and the emitter region of the second bipolar transistor 2, it is not necessary to provide device isolation and wiring when the emitter and the collector of the adjacent bipolar transistors are interconnected, and a semiconductor device including highly integrated, low resistance and low capacitance bipolar transistors is attained.

In the present embodiment, the collector and the emitter of the adjacent npn-type bipolar transistors are formed by one diffusion layer. The present invention may also be applied to the formation of a source and a drain of adjacent n-type MOS transistors, or the formation of a collector or emitter of an npn-type bipolar transistor and a source or drain of the adjacent n-type MOS transistor, to attain a similar effect.

<Embodiment 2>

Figure 9:
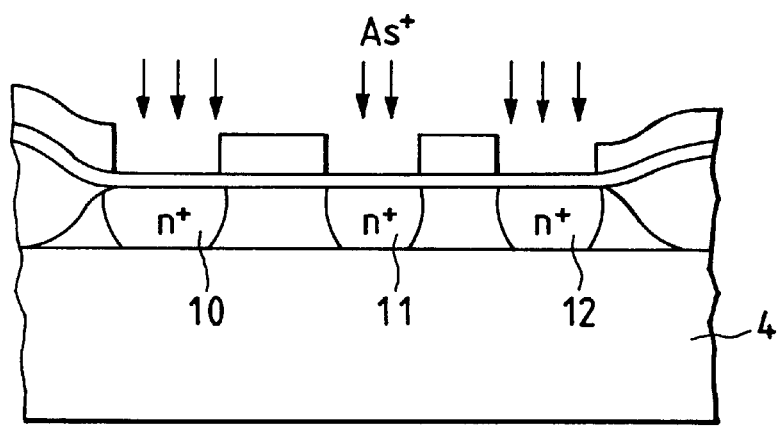
FIG. 9 shows a sectional view of a manufacturing process of the semiconductor device of FIG. 1.

FIGS. 8 to 12 show a manufacturing process of a second embodiment of the present invention. Like in Embodiment 1, a substrate having an n⁻-type Si layer formed on the insulating layer 4 is prepared (FIG. 8), and the emitter and collector 10, 11 and 12 are formed by the photo-lithography process and the $As^+$ ion implantation process (FIG. 9).

Figure 10:
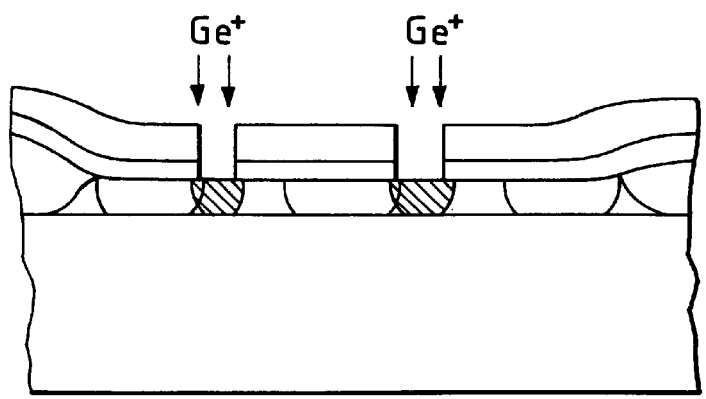
FIG. 10 shows a sectional view of the manufacturing process of the semiconductor device of FIG. 1.

Then, an NSG film is formed to a thickness of 2000 Å by the CVD process under the atmospheric pressure, the oxidization film in the base and in the vicinity of the base is removed by the photo-lithography process, and $Ge^+$ ions are implanted (FIG. 10).

Figure 11:
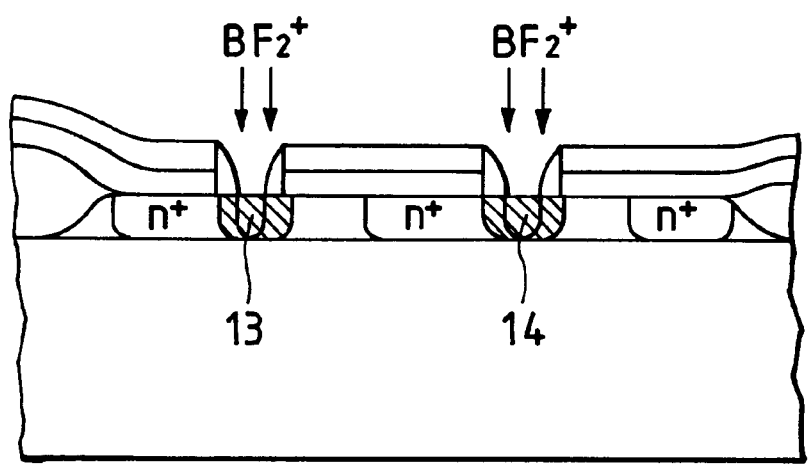
FIG. 11 shows a sectional view of the manufacturing process of the semiconductor device of FIG. 1.

Then, an SiN film is deposited to a thickness of 3000 Å and a sidewall is formed as shown in FIG. 11.

Figure 12:
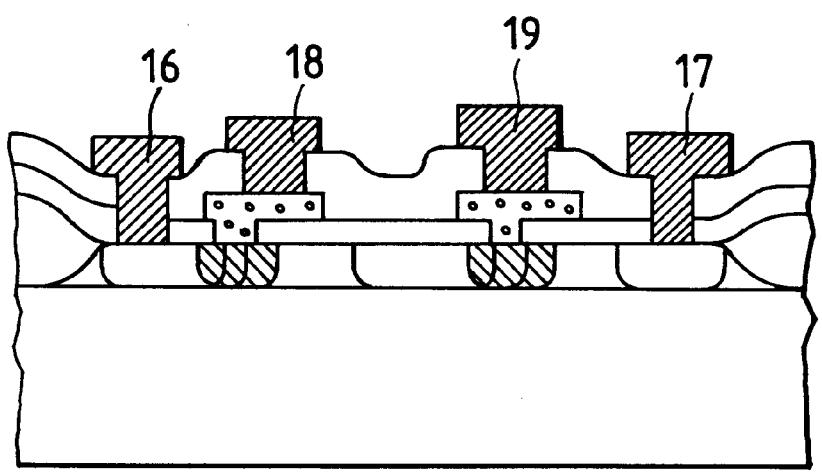
FIG. 12 shows a sectional view of a manufacturing process of the semiconductor device of FIG. 1.

Then, $BF_2^+$ ions are implanted at 10 KeV at $2\times10^{13}$ cm⁻², and the assembly is thermally processed to form the regions 13 and 14. Then, the electrodes 16 to 19 are formed as shown in FIG. 12 and the hetero-junction bipolar transistor shown in FIG. 1 is formed in the same manner as that of Embodiment 1.

A base width of the bipolar transistor formed in this manner is 1 μm or less, and $f_T$ is 70 times as high as that of the prior art transistor.

<Embodiment 3>

Figure 13:
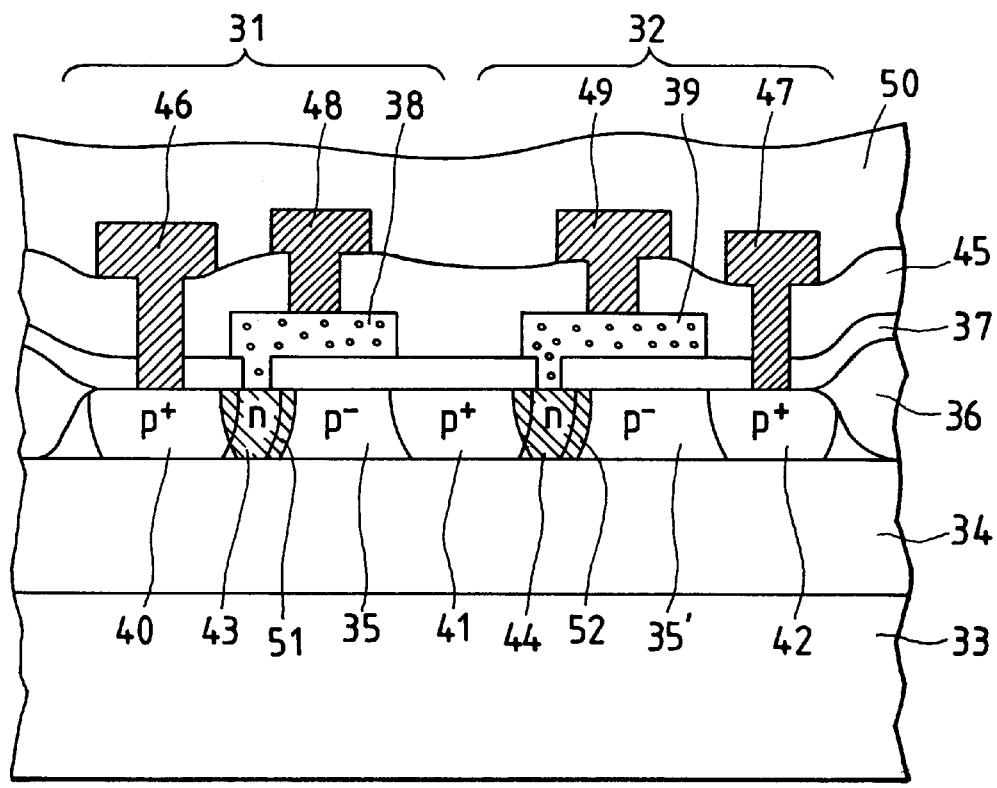
FIG. 13 shows a sectional view of third embodiment of the semiconductor device of the present invention.
Figure 14:
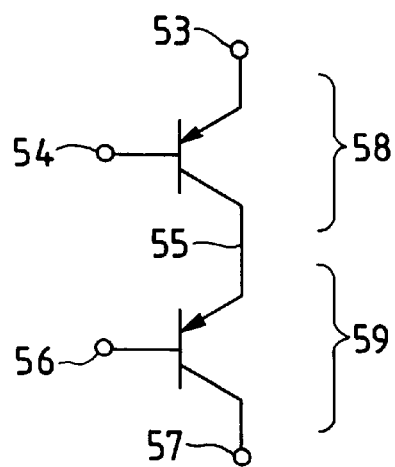
FIG. 14 shows an equivalent circuit of the semiconductor device of FIG. 13.

FIG. 13 shows a sectional view of a third embodiment of the semiconductor device of the present invention, and FIG. 14 shows an equivalent circuit thereof.

In FIG. 13, numeral 31 denotes a first pnp-type transistor, numeral 32 denotes a second pnp-type bipolar transistor, numeral 33 denotes a silicon substrate, numeral 34 denotes an insulating film, numerals 35 and 35' denote p⁻-type silicon layers formed on the insulating film 34, numeral 36 denotes a selective oxidization layer, numeral 37 denotes a gate oxidization film, numeral 38 denotes an n-type polysilicon layer which serves as a base electrode of the first bipolar transistor 31, numeral 39 denotes an n-type polysilicon layer which serves as a base electrode of the second bipolar transistor 32, numeral 40 denotes a p$^+$-type region which serves as an emitter of the first bipolar transistor 31, numeral 41 denotes a p$^+$-type region which serves as an emitter of the second bipolar transistor 32, numeral 42 denotes a p$^+$-type region which serves as a collector of the second bipolar transistor 32, numeral 43 denotes an n-type region which serves as a base of the first bipolar transistor 31, numeral 44 denotes an n-type region which serves as a base of the second bipolar transistor 32, numeral 45 denotes an interlayer insulating layer, numeral 46 denotes an emitter electrode of the first bipolar transistor 31, numeral 47 denotes a base electrode of the first bipolar transistor 31, numeral 49 denotes a base electrode of the second bipolar transistor 32, and numeral 50 denotes a passivation film. Numerals 51 and 52 denote $Si_{(1-X)}Ge_X$ regions.

In FIG. 14, numeral 58 denotes the first pnp-type bipolar transistor 31, numeral 59 denotes the second pnp-tpe bipolar transistor 32, numeral 53 denotes the emitter electrode of the first bipolar transistor, numeral 54 denotes the base electrode of the first bipolar transistor, numeral 55 denotes the collector electrode of the first bipolar transistor and the emitter electrode of the second bipolar transistor, numeral 56 denotes the base electrode of the second bipolar transistor, and numeral 57 denotes the collector electrode of the second bipolar transistor.

In the present embodiment, the lateral bipolar transistor having the $Si_{(1-X)}Ge_X$ regions 51 and 52 of narrow gap in the n-type base region and in the vicinity thereof can be formed.

In the present embodiment, since the P$^+$ layer 41 on the insulating film functions as both the collector region of the first bipolar transistor 31 and the emitter region of the second bipolar transistor 32, it is not necessary to provide device isolation and wiring when the collector and the emitter of the adjacent bipolar transistors are interconnected, as it is in Embodiment 1, and a semiconductor device including highly integrated, low resistance and low capacitance bipolar transistors is attained.

In the present embodiment, the collector and the emitter of the adjacent pnp-type transistors are formed on one diffusion layer. The present invention may also be applied to the formation of a source and a drain of adjacent p-type MOS transistors, or the formation of a collector or emitter of a pnp-type bipolar transistor and a source or drain of an adjacent p-type MOS transistor to attain a similar effect.

<Embodiment 4>

Figure 15:
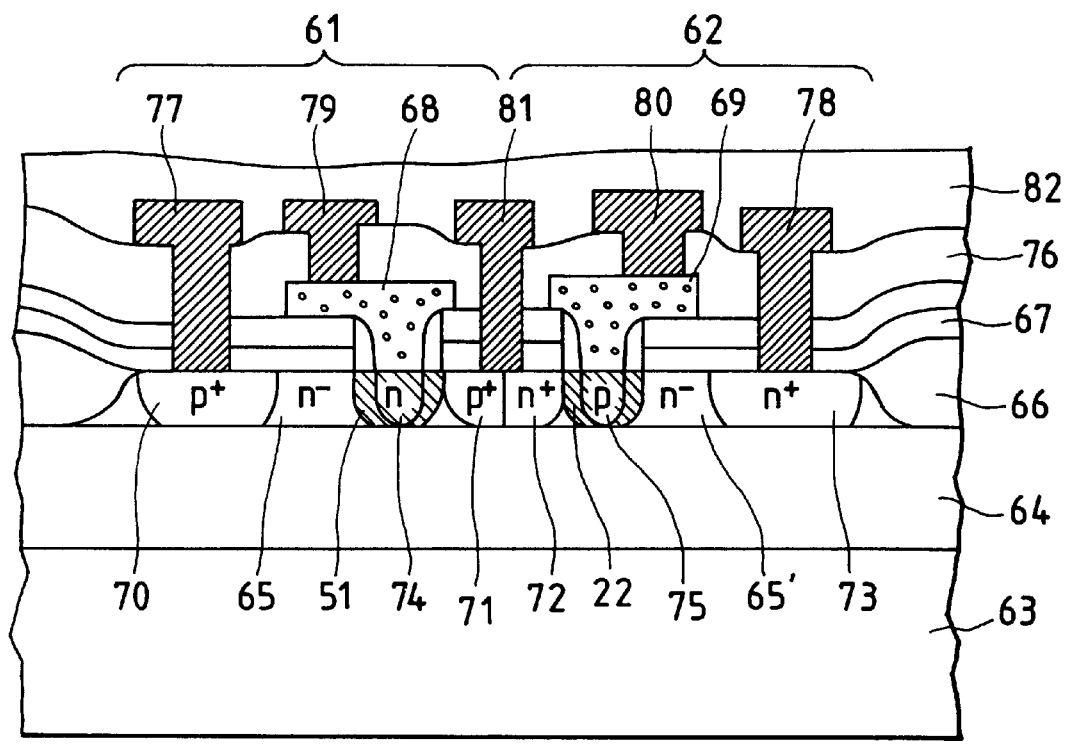
FIG. 15 shows a sectional view of a fourth embodiment of the semiconductor device of the present invention.
Figure 16:
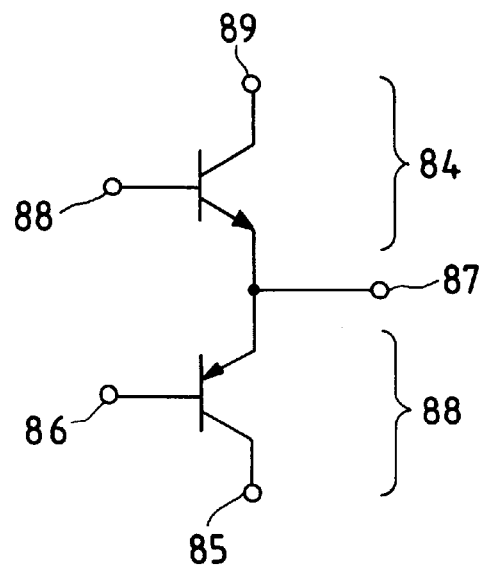
FIG. 16 shows an equivalent circuit of the semiconductor device of FIG. 15.

FIG. 15 shows a sectional view of a fourth embodiment of the present invention and FIG. 16 shows an equivalent circuit thereof.

In FIG. 15, numeral 61 denotes a pnp-type bipolar transistor, numeral 62 denotes an npn-type bipolar transistor, numeral 63 denotes a silicon substrate, numeral 64 denotes an insulating film, numerals 65 and 65' denote n$^-$-type silicon layers formed on the insulating film 64, numeral 66 denotes a selective oxidization layer, numeral 67 denotes a gate oxidization film, numeral 68 denotes an n-type polysilicon layer which serves as a base electrode of the bipolar transistor 61, numeral 69 denotes a p-type polysilicon layer which serves as a base electrode of the bipolar transistor 62, numeral 70 denotes a p$^+$-type region which serves as a collector of the bipolar transistor 61, numeral 71 denotes a p$^+$-type region which serves as an emitter of the bipolar transistor 61, numeral 72 denotes an n$^+$-type region which serves as an emitter of the bipolar transistor 62, numeral 73 denotes an n$^+$-type region which serves as a collector of the bipolar transistor 61, numeral 75 denotes a p-type region which serves as a base of the bipolar transistor 62, numeral 76 denotes an interlayer insulating layer, numeral 77 denotes a collector electrode of the bipolar transistor 61, numeral 78 denotes a collector electrode of the bipolar transistor 62, numeral 79 denotes a base electrode of the bipolar transistor 61, numeral 80 denotes a base electrode of the bipolar transistor 62, numeral 81 denotes an emitter electrode of the bipolar transistor 61 and an emitter electrode of the bipolar transistor 62, and numeral 82 denotes a passivation film.

Numerals 51 and 22 denote $Si_{(1-X)}Ge_X$ regions. They are formed in the same manner as those of Embodiment 2. The $Si_{(1-X)}Ge_X$ regions are first formed, and a sidewall is formed and the p-type and n-type base regions are formed.

In FIG. 16, numeral 83 denotes the pnp-type bipolar transistor 61, numeral 84 denotes the npn-type bipolar transistor 62, numeral 85 denotes the collector electrode of the bipolar transistor 83, numeral 86 denotes the base electrode of the bipolar transistor 83, numeral 87 denotes the emitter electrode of the bipolar transistor 83 and the emitter electrode of the bipolar transistor 84, numeral 88 denotes the base electrode of the bipolar transistor 84, and numeral 89 denotes the collector electrode of the bipolar transistor 84.

In the present embodiment, the n$^+$-type layer 71 and the n$^+$-type layer 72 on the insulating film are electrically connected by one electrode 81 to function as both the emitter region of the pnp-type bipolar transistor 61 and the emitter region of the npn-type bipolar transistor 62. Accordingly, it is not necessary to provide device isolation and long wiring when the emitters of the adjacent bipolar transistors are interconnected, and a semiconductor device including highly integrated, low resistance and low capacitance transistors is attained.

In the present embodiment, the emitter of the npn-type bipolar transistor and the emitter of the adjacent pnp-type are formed on one diffusion layer. The present invention is also applicable to the formation of a source or drain of an n-type MOS transistor and a source or drain of an adjacent p-type MOS transistor, or the formation of a collector or emitter of an npn-type bipolar transistor and a source or drain of an adjacent p-type MOS transistor, or the formation of a collector or emitter of a pnp-type bipolar transistor and a source or drain of an adjacent n-type MOS transistor to attain a similar effect.

<Embodiment 5>

Figure 17:
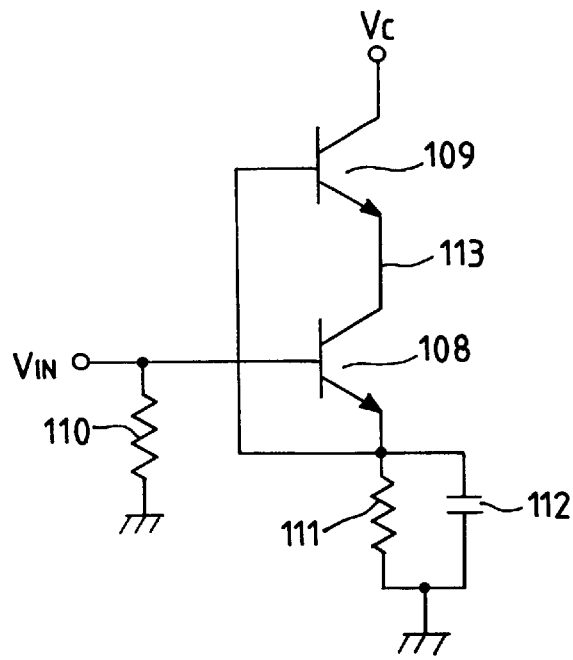
FIG. 17 shows an equivalent circuit of a high speed amplifier circuit in accordance with a fifth embodiment of the semiconductor device of the present invention.

FIG. 17 shows an equivalent circuit of a high speed amplifier circuit of a fifth embodiment of the semiconductor device of the present invention, which comprises npn-type bipolar transistors 108 and 109, resistors 110 and 111 and a capacitor 112. Those circuit components are formed on a silicon layer on an insulating layer. A terminal 113 is formed in one n$^+$-type region as it is in Embodiment 1 and functions as an emitter regions of the bipolar transistor 109 and a collector region of the bipolar transistor 108.

In the present embodiment, the reduction of a chip size by as much as approximately 20% of that of a prior art device and the improvement of an operation speed by approximately 50% are attained.

<Embodiment 6>

Figure 18:
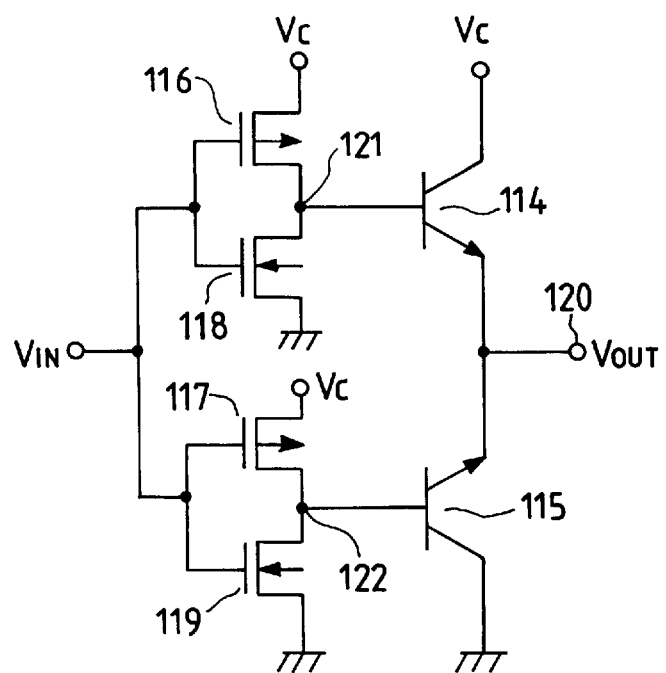
FIG. 18 shows an equivalent circuit of a sixth embodiment of the semiconductor device of the present invention.

FIG. 18 shows an equivalent circuit of a sixth embodiment of the semiconductor device of the present invention.

FIG. 18 shows a complementary BiCMOS circuit which comprises npn-type bipolar transistors 114 and 115, p-type MOS transistors 116 and 117 and n-type MOS transistors 118 and 119. Those circuit components are formed on a silicon layer on an insulating film. A terminal 120 is formed in one n$^+$-type region as it is in Embodiment 1 to function as an emitter region of the bipolar transistor 114 and an emitter region of the bipolar transistor 115. Terminals 121 and 122 are formed by an n+-type region and a p+-type region which are electrically connected by one electrode as they are in Embodiment 4 to function as a source region and a drain region of the MOS transistor.

A ring oscillator and a shift register constructed by using the present embodiment attains the chip size reduction of approximately 40% and the improvement of the operation speed of approximately 80% over those of a prior art bulk type circuit.

<Embodiment 7>

FIG. 19 shows a seventh embodiment of the present invention.

FIG. 19 shows a sectional view of the present embodiment. Numeral 1 denotes an npn-type bipolar transistor, numeral 3 denotes a silicon substrate, numeral 4 denotes an insulating film, numeral 5 denotes an n-type silicon layer formed on the insulating film 4, numeral 6 denotes a selective oxidization layer, numeral 8 denotes a p-type polysilicon layer which serves as a base electrode, numeral 10 denotes an n+-type region which serves as an emitter, numeral 11 denotes an n+-type region which serves as a collector, numeral 12 denotes a p-type region and an $Si_{(1-x)}Ge_x$ region which serve as gates, numerals 13 and 13' denote interlayer insulating layers, numeral 14 denotes an emitter electrode, numeral 15 denotes a collector electrode and numeral 16 denotes a base electrode.

Numeral 18 denotes an SiGe region. Less Ge is contained in the area facing the emitter 10 and more in the area facing the collector 5.

A method for forming the SiGe region is now explained.

Figure 21A:
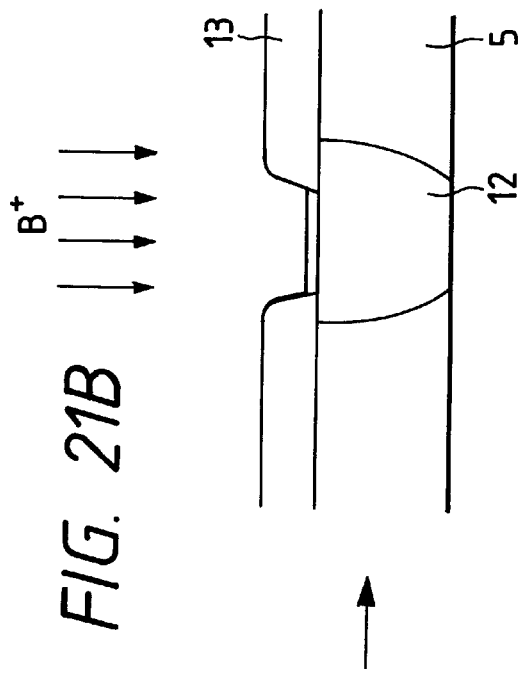
FIG. 21C shows a concentration of Ge.
Figure 21B:
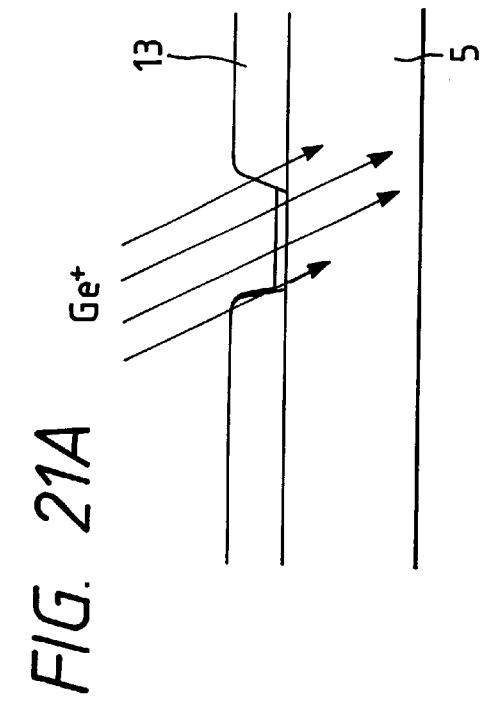

FIGS. 21A to 21B show a method for forming the SiGe layer in the seventh embodiment of the present invention. In FIG. 21A, the interlayer insulating layer ($SiO_2$) 13 is deposited to a thickness of 500 Å by the CVD process and an opening is formed in the base region by the photo-lithography process and the etching process. In the present embodiment, the base width is set to 0.8 μm.

Figure 21C:
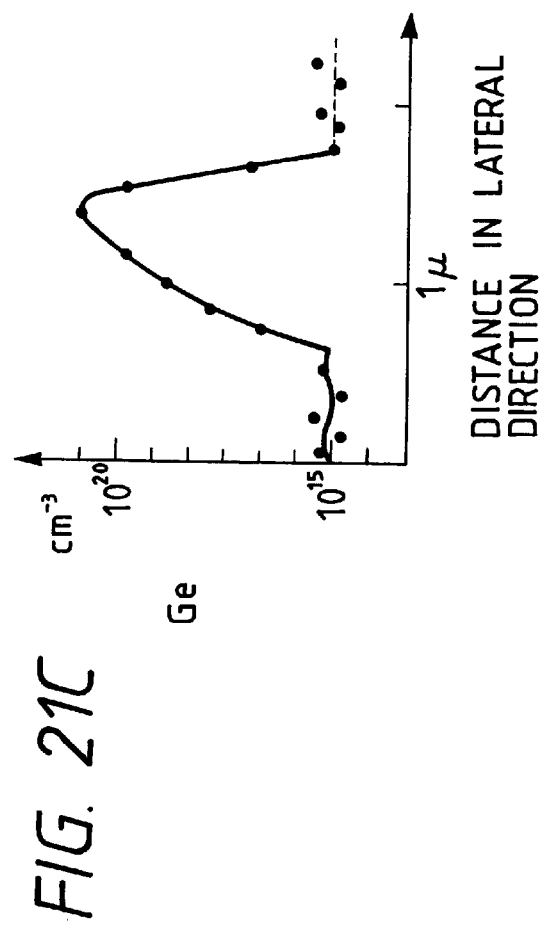

Then, a buffer oxidization film is grown (by a pyro-oxidization process at 900° C.) to a thickness of 200 Å on the exposed semiconductor layer 5. Then, Ge+ ions are implanted from the emitter by an oblique ion implantation process. In the present embodiment, a medium current ion implantation apparatus is used and the Ge+ ions are implanted at an implantation angle of 45°, an acceleration voltage of 180K eV and a plane density of ions of $5\times10^{16}$ $cm^{-2}$. Further, as shown in FIG. 21B, B+ ions are implanted at 30K eV and $3\times10^{13}$ $cm^{-2}$. Then, it is RAT heat processed at 1050° C. and 10 mm. FIG. 21C shows a plot of a peak density of the Ge atoms by SIMS (secondary ion mass analysis) on an ordinate and a distance on an abscissa.

Then, the buffer oxidization film is removed and a p-type polysilicon is deposited to a thickness of 400 Å by the LPCVD process. The lateral bipolar transistor formed in this manner exhibits $f_T$ which is approximately three times as high as that of a prior art device, and $h_{FE}$ which is 150 at maximum and approximately 8 times as high as that of the device without Ge.

<Embodiment 8>

Figure 22A:
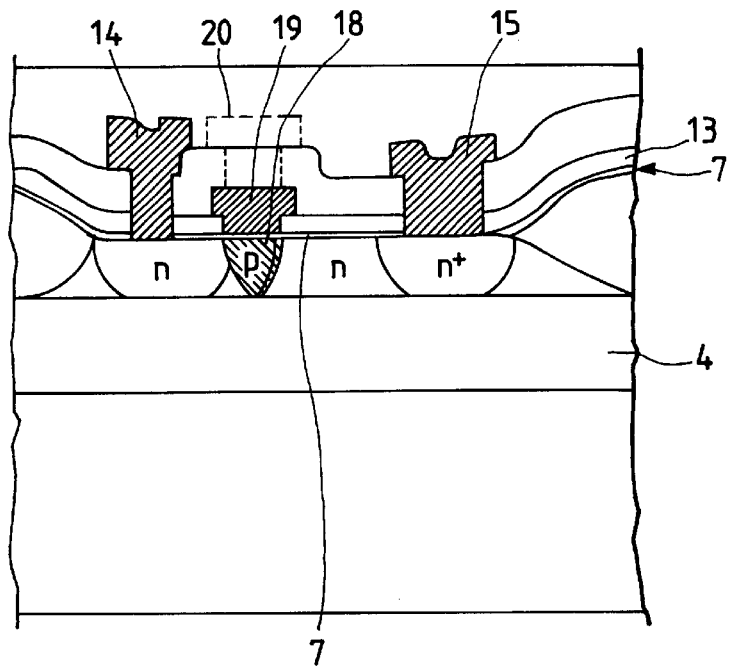
FIG. 22A shows a sectional view of an eighth embodiment.
Figure 22B:
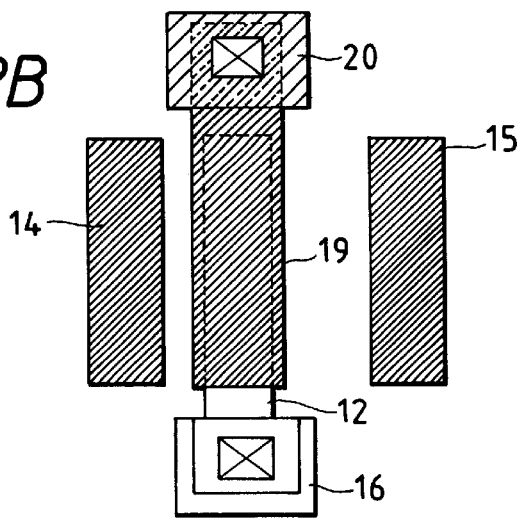
FIG. 22B shows a plan view of the eighth embodiment.

FIGS. 22A and 22B show an embodiment of a lateral bipolar transistor having a gate electrode. FIG. 22A shows a sectional view of Embodiment 8 and FIG. 22B shows a plan view thereof.

In FIGS. 22A and 22B, numeral 18 denotes an SiGe region which is formed in the same manner as that of Embodiment 1. Numeral 19 denotes a polysilicon which forms a gate electrode and numeral 20 denotes a gate lead electrode. Numeral 12 denotes a base region and numeral 16 denotes a base electrode. Other numerals are identical to those of Embodiment 1. A gate oxidization film 7 has a thickness of 280 Å and is formed by the thermal oxidization process. The conditions to form the SiGe region and the base region are identical to those in Embodiment 7.

Figure 22C:
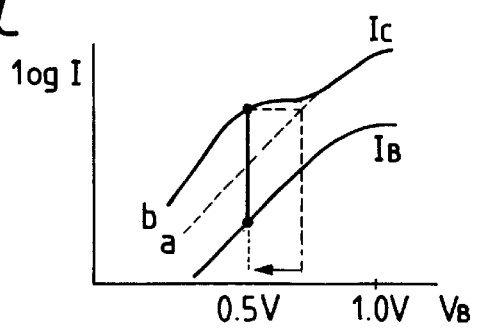
FIG. 22C shows a collector current $I_C$ and a base current $I_B$ when a voltage is applied to a base region through a base electrode.

The device of Embodiment 8 exhibits a $V_{BE}$–I characteristic as shown in FIG. 22C when a voltage is applied to the gate.

In FIG. 22C, a curve as shown by a broken line indicates a collector current $I_C$ when no voltage is applied to the gate electrode, and a curve b indicates a collector current $I_C$ when a gate potential is kept at –1.0 volt. By comparing those, it is seen that the curve b is larger than the curve a when the base-emitter voltage $V_{BE}$ is 0.5 volt. Accordingly, it is seen that in a transistor having a constant voltage applied to the gate electrode, the current amplification factor $h_{FE}$ (=$I_C/I_B$) is large when $V_{BE}$ is small. When the gate electrode potential is –1.0 volt and $V_{BE}$32 0.5 volt, $h_{FE}$ is as large as 5000. Accordingly, by controlling the gate electrode, a high current ($I_C$) is attained with a low voltage ($V_{BE}$) and a large $I_C/I_B$ (current amplification factor $h_{FE}$) is attained, where $I_B$ is a base current. It is thus seen that the transistor is of low power consumption and low noise.

Since such a model bipolar transistor with a gate may be manufactured in a similar process to the MOS process, a Bi-CMOS circuit can be simply manufactured. Further, a device which is of low voltage and high current drive power is attained.

<Embodiment 9>

In Embodiment 7 and Embodiment 8, Ge ions are implanted by using the interlayer insulating masks as a shadow mask. Alternatively, Ge+ ions may be obliquely implanted by using the polysilicon as the shadow mask to attain the same effect.

Figure 23:
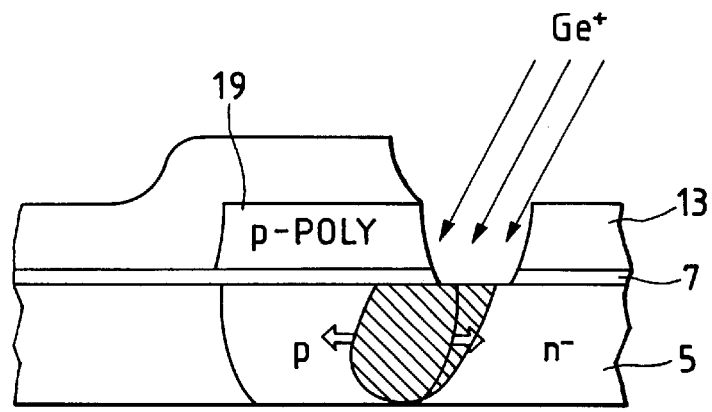
FIG. 23 shows a manufacturing process of a ninth embodiment.

In the ninth embodiment, a polysilicon shown in FIG. 23 is used as the shadow mask. FIG. 23 shows a lateral bipolar transistor having a similar gate electrode to that of Embodiment 8. After a p-type polysilicon layer of the gate electrode is formed, an interlayer insulating layer is deposited to a thickness of 4500 Å and the interlayer insulating layer 13 facing the collector, and the gate insulation film 7 are removed. Then, Ge+ ions are implanted at 150K eV and $5\times10^{16}$ $cm^{-2}$ to form the device. A similar characteristic to that of Embodiment 8 is attained.

<Embodiment 10>

Figure 24:
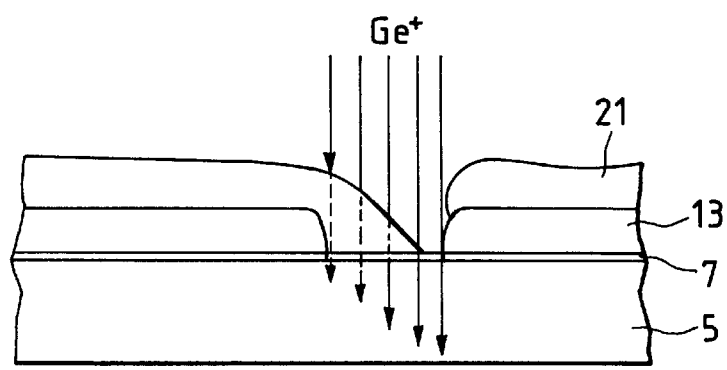
FIG. 24 shows a manufacturing process of a tenth embodiment.

In embodiments 7–9, Ge ions are obliquely implanted. Alternatively, the film thickness of the mask material may be controlled to control the proportion of Ge. In FIG. 24, organic resin is used. A photo-mask for the base is used as the interlayer insulating layer 13, an opening is formed in the base region, a photoresist having a viscosity of 100 cps or higher is used, and spin coating is conducted at a high revolution of 4000 revolutions per second or higher to form a thin resist film 21 (to 3000 Å). A film thickness of the resist in the base opening area varies from place to place as shown in FIG. 24. Then, Ge ions are implanted at 200K eV and $8\times10^{16}$ $cm^{-2}$.

After the application of the photo-resist film, it may be exposed to a light and weakly developed (for approximately 10 seconds) to reduce the resist film thickness (1000–0 Å in the base opening).

<Embodiment 11>

Figure 25:
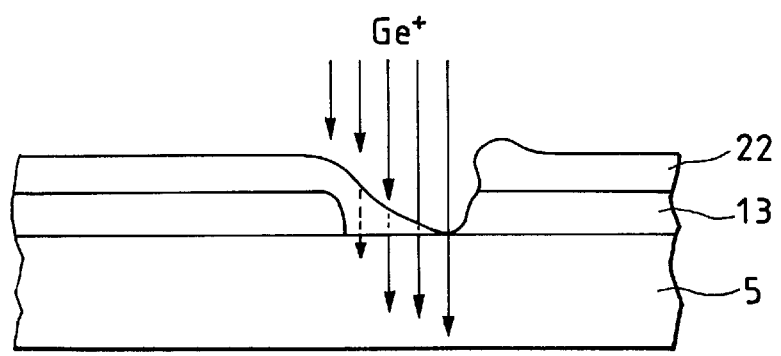
FIG. 25 shows a manufacturing process of an eleventh embodiment.

An embodiment which use SOG (spin on glass) is explained. SOG set to a viscosity of 10 cp is applied (22) to a thickness of approximately 2000 Å as it is in Embodiment 4, and it is fired at 400° C. Then, the SOG film is etched back so that it has a film thickness of 500–0 Å in the base opening (FIG. 25). Then, Ge⁺ ions are implanted at 180K eV and $5 \times 10^{16}$ cm$^{-2}$.

A lateral bipolar transistor formed in Embodiment 11 has $f_T$ of 10 GHz and can be operated at a speed of approximately five times as high as that of the prior art lateral bipolar transistor.

<Embodiment 12>

Figure 26:
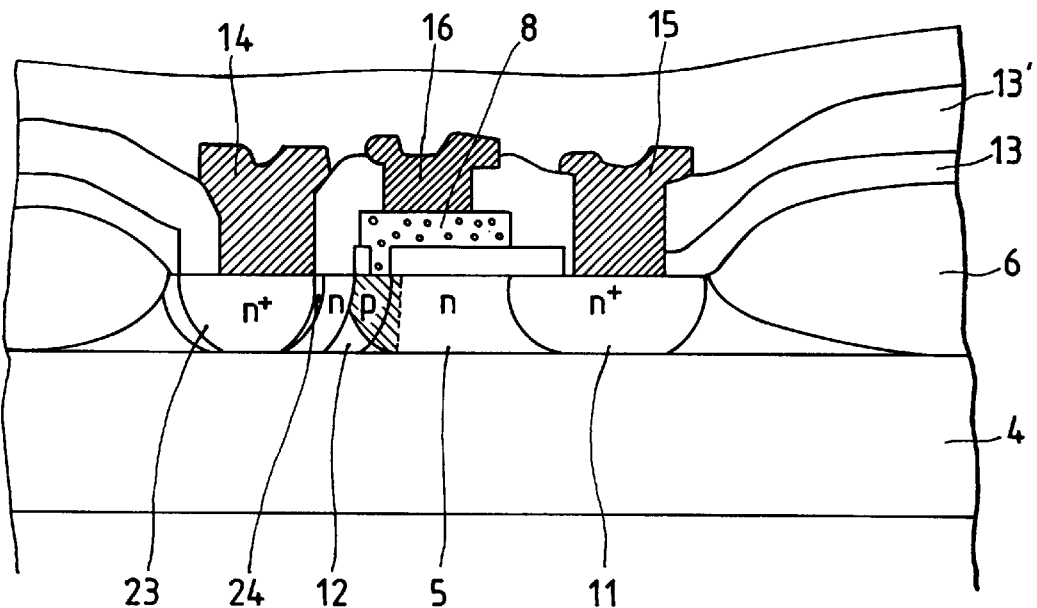
FIG. 26 shows a sectional view of a twelfth embodiment.

An Si—Ge base region is formed as it is in Embodiment 7, and an Si single crystal area of the emitter is removed as shown in FIG. 26 and an n⁺ polysilicon 23 is deposited by the LPCVD process. An oxidization film 24 of 8 Å thickness is present in an interface of the Si single crystal and the polysilicon. Other numerals are identical to those of the previous embodiment.

In the bipolar transistor of the structure shown in FIG. 26, the current amplification factor ($h_{FE}$) exceeds 10,000 and $f_T$ is as high as 12 GHz. By using the polysilicon emitter, the base current can be suppressed low and $h_{FE}$ is increased. When the impurity in the polysilicon of the emitter is activated, the emitter is crystallized if the oxidization film 24 is not present and the effect of increasing $h_{FE}$ is diminished to the extent of Embodiment 7. The oxidization film may be formed in the base-emitter junction.

<Embodiment 13>

Figure 27:
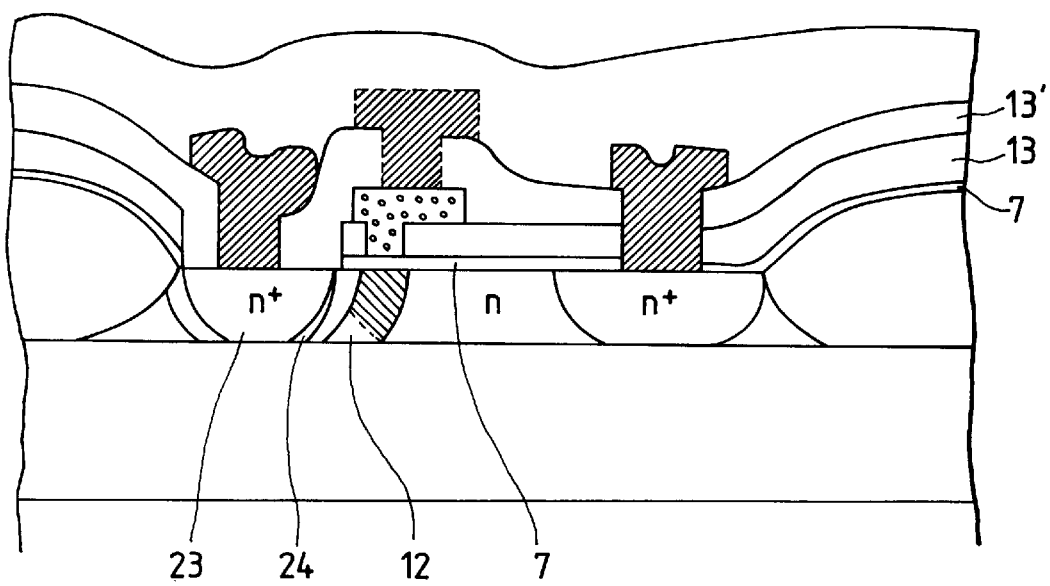
FIG. 27 shows a sectional view of a thirteenth embodiment.
Figure 28:
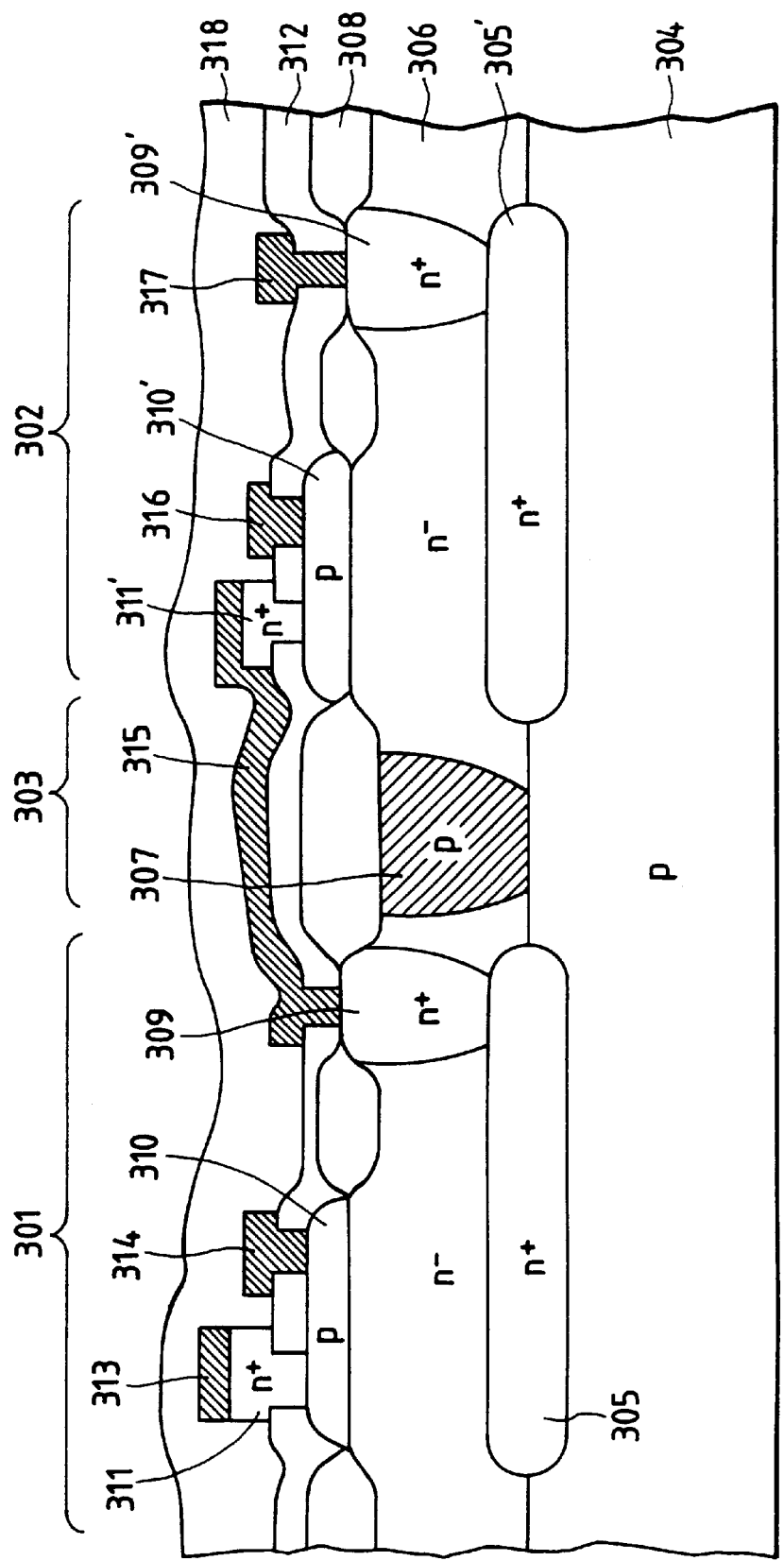
FIG. 28 shows a sectional view of a prior art vertical bipolar transistor.
Figure 29:
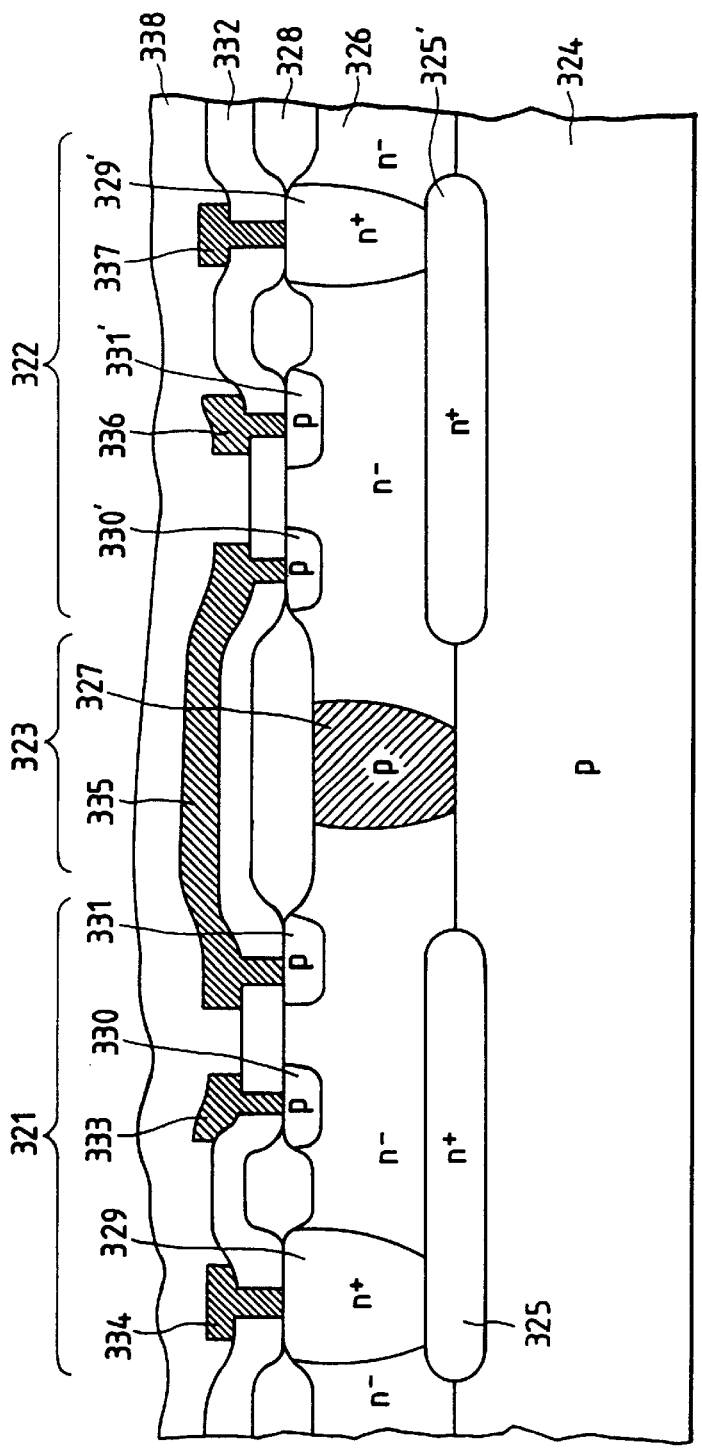
FIG. 29 shows a sectional view of a prior art lateral bipolar transistor.
Figure 30:
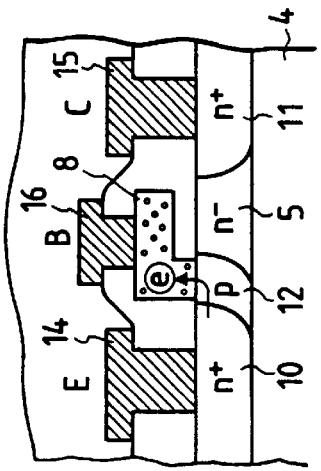
FIG. 30 shows a sectional view of a prior art lateral bipolar transistor on the insulator layer.

FIG. 27 shows an embodiment of a device which utilizes the advantage of Embodiment 6 and provides a gate electrode on a base to allow the control of the potential as it does in Embodiment 8. Numerals are identical to those of the previous embodiment. It can further improve $f_T$ over Embodiment 12 because the emitter concentration can be reduced and hence $C_{BE}$ can be reduced.

What is claimed is:

1. A semiconductor device having an emitter region, a base region, and a collector region, formed on an insulating substrate laterally, wherein said emitter region, said base region, and said collector region are each disposed on said insulating substrate, said base region includes a SiGe mixed crystal semiconductor region, and a base electrode formed of polysilicon is connected to said SiGe mixed crystal semiconductor region, said device having an emitter junction between said base region and said emitter region and a collector junction between said base region and said collector region, wherein a forbidden bandwidth of said base region is reduced from the emitter junction toward the collector junction.

2. A semiconductor device according to claim 1, wherein said SiGe mixed crystal semiconductor region is in the vicinity of the junction of said emitter region and said base region.

3. A semiconductor device according to claim 1 wherein a forbidden band width of said base region is varied from the emitter junction to the collector junction.

4. A semiconductor device according to claim 1, wherein the Ge concentration of said SiGe mixed crystal semiconductor is increased from the emitter junction to the collector junction.

5. A semiconductor device according to claim 1 wherein an insulating film is formed in contact to said base region to control a potential of said base region, and an electrode is formed in contact to said insulating film.

6. A semiconductor device according to claim 1 wherein an insulating film is formed on an interface of said base region and said emitter region.

7. A semiconductor device according to claim 1 wherein an insulating film is formed on said emitter region.

8. A semiconductor device according to claim 1, wherein said SiGe mixed crystal semiconductor region is included in the vicinity of a junction of said collector region and said base region.

9. A semiconductor device according to claim 1, wherein said SiGe mixed crystal semiconductor region is included in the vicinity of a junction of said emitter region and said base region.

* * * * *

UNITED STATES PATENT AND TRADEMARK OFFICE
CERTIFICATE OF CORRECTION

PATENT NO. : 6,246,104 B1
DATED : June 12, 2001
INVENTOR(S) : Hisanori Tsuda et al.

It is certified that error appears in the above-identified patent and that said Letters Patent is hereby corrected as shown below:

Title page,
Item [56], References Cited, OTHER PUBLICATIONS, "Sato et al." (second occurrence) should be deleted.
Item [56], ABSTRACT,
Line 4, "region" (first occurrence) should read -- region, --.

Column 1,
Line 52, "327" should read -- 325' --.

Column 2,
Line 15, "order," should read -- order --;
Line 27, "serves" should read -- serve --; and
Line 28, "is" should read -- are --.

Column 3,
Line 31, "attained," should read -- attained; --;
Line 37, "built in" should read -- built-in --;
Line 38, "then" should read -- than --;
Line 43, "provides" should read -- provide --; and
Line 44, "provide" should read -- provides --.

Column 4,
Line 2, "parallelly" should read -- parallel --;
Line 44, "of" should read -- of a --; and
Line 63, "B-B' of FIG. 1," should read -- B-B' of FIG. 19, --.

Column 5,
Line 45, "affect" should read -- effect --.

Column 6,
Line 3, "exhibits" should read -- exhibit --;
Line 35, "affect" should read -- effect --; and
Line 56, "BB'" should read -- B-B' --.

Column 9,
Line 19, "pnp-tpe" should read -- pnp-type --.

Column 10,
Line 52, "regions" should read -- region --.

UNITED STATES PATENT AND TRADEMARK OFFICE
CERTIFICATE OF CORRECTION

PATENT NO. : 6,246,104 B1
DATED : June 12, 2001
INVENTOR(S) : Hisanori Tsuda et al.

It is certified that error appears in the above-identified patent and that said Letters Patent is hereby corrected as shown below:

Column 11,
Line 30, "collector 5." should read -- collector 15. --.

Column 12,
Line 19, "$V_{BE}32$ 0.5 volt," should read -- $V_{BE}$ = 0.5 volt, --; and
Line 64, "use" should read -- uses --.

Column 14,
Lines 14, 21, 25 and 28, "claim 1" should read -- claim 1, --.

Signed and Sealed this

Ninth Day of July, 2002

Attest:

JAMES E. ROGAN
*Attesting Officer*     *Director of the United States Patent and Trademark Office*